Aug. 4, 1970 D. E. NIEMOELLER ET AL 3,523,258

LINEAR TRIMMING DEVICE FOR TEMPERATURE CONTROLLED CRYSTAL OSCILLATOR

Filed Sept. 26, 1968

INVENTORS
DONALD E. NIEMOELLER
WILLIAM E. REINHARDT

BY

Trask, Jenkins & Hanley

ATTORNEYS

United States Patent Office 3,523,258
Patented Aug. 4, 1970

3,523,258
LINEAR TRIMMING DEVICE FOR TEMPERATURE CONTROLLED CRYSTAL OSCILLATOR
Donald E. Niemoeller, Lafayette, Ind., and William E. Reinhardt, Sandwich, Ill., assignors to Arvin Industries, Inc., Columbus, Ind., a corporation of Indiana
Filed Sept. 26, 1968, Ser. No. 762,905
Int. Cl. H03b *5/36*
U.S. Cl. 331—116 9 Claims

ABSTRACT OF THE DISCLOSURE

A temperature compensated crystal controlled oscillator having a linearizing circuit connected thereto for maintaining linear temperature compensation while the oscillator's frequency is adjusted to compensate for aging of the crystal. A transistor is connected in the oscillator circuit with its base electrode being controlled by a crystal connected through a varactor diode to ground. The varactor is controlled by a regulated voltage applied to the diode through a compensating circuit which includes thermistors. A capacitor is connected in parallel with the crystal for providing an adjustment for changing the crystal frequency back to its nominal value after it has aged. Adjustment of the variable capacitor causes a change in the network temperature characteristics so that the frequency of the oscillator no longer remains within tightly controlled limits over a wide temperature range. To alleviate this problem a second varactor diode and a capacitor are connected in series with each other and in parallel with the trimming capacitor, and the voltage across the second varactor is controlled by said compensating circuit.

BACKGROUND OF THE INVENTION

It is common practice to couple a crystal into an oscillator circuit when it is desired to accurately control the oscillator frequency. When, however, the oscillator is subject to a wide temperature variation, the resonant frequency of the crystal can vary as much as thirty parts per million (30 p.p.m.) over a temperature of —40 C. to +70 C., for example. For a 3 mHz. (megacycle per second) oscillator this variation amounts to 90 cycles per second over the temperature range. In many applications this magnitude of variation would be unacceptable, and it may be necessary to hold such frequency variation to a magnitude of ±0.1 p.p.m., or a total range over the temperature extremes of 0.6 cycles per second. Various methods are known in the art for compensating a crystal controlled oscillator to operate over a wide temperature range with a limited variance in its resonant frequency. However, a crystal is also subject to changes in frequency due to aging, and therefore it is necessary to readjust the nominal frequency of the oscillator periodically. Such readjustment can be made by placing a variable capacitor in parallel with the crystal and by varying capacitor. When the capacitor is adjusted, however, the temperature compensating characteristic of the circuit is changed so that it no longer operates linearly over the temperature range. Therefore, it is an object of this invention to provide a device which will permit the oscillator frequency to be trimmed by means of a variable capacitor, but which will maintain linear temperature compensation over the desired temperature range.

SUMMARY OF THE INVENTION

In accordance with the invention we provide a temperature compensated crystal oscillator having a variable capacitor connected therein for trimming the oscillator frequency to the proper value after the crystal has aged and its resonant frequency has drifted from its nominal value. A linearizing circuit is included for ensuring that the temperature compensation remains accurately effective when the oscillator frequency has been trimmed by adjusting the variable capacitor.

In particular, a compensating circuit comprising a plurality of resistors, including several thermistors, is connected to the oscillator to apply a varying voltage to a varactor diode. The varactor diode provides a voltage varying capacitance which forms a part of the load seen by the crystal. Thus, as temperature variations cause the crystal to shift frequency, said variations also cause the resistance values of the thermistors to change, thereby changing the voltage which is applied to the varactor diode. The compensating circuit is designed to change its resistance and change the resulting voltage applied to the varactor diode in proportion with the temperature caused shifts in resonant frequency of the crystal. Thus, the oscillator puts out a constant frequency even though it is subjected to a large temperature variation.

A manually variable capacitor is connected to form a portion of the load on the crystal for changing the resonant frequency of the crystal, as that frequency drifts due to aging. It is an inherent problem of temperature compensated crystal oscillators that when the frequency is adjusted as by varying a capacitor, the characteristic of the compensating circuit is no longer sufficient to hold the frequency of the oscillator constant over the temperature range. In accordance with our invention, a second varactor diode is coupled in series combination with a fixed capacitor and said combination is coupled in parallel with the variable capacitor. The voltage of the compensating network is coupled to the second varactor diode, and such connections provide a linearizing effect on the compensation characteristic for the crystal. Further, if the nominal capacitance values of the varactor diodes are made equal, and the value of the capacitor in series with the second varactor diode is chosen to be approximately one-half of the nominal capacitance value of the varactor diodes, then the characteristic of the compensating circuit will remain linear as adjustments are made by changing the value of the manually variable capacitor.

BRIEF DESCRIPTION OF THE DRAWING

The accompanying drawing illustrates the invention. In such drawing.

DETAILED DESCRIPTION OF THE PREFERRED EMBODIMENT

Figure 1:
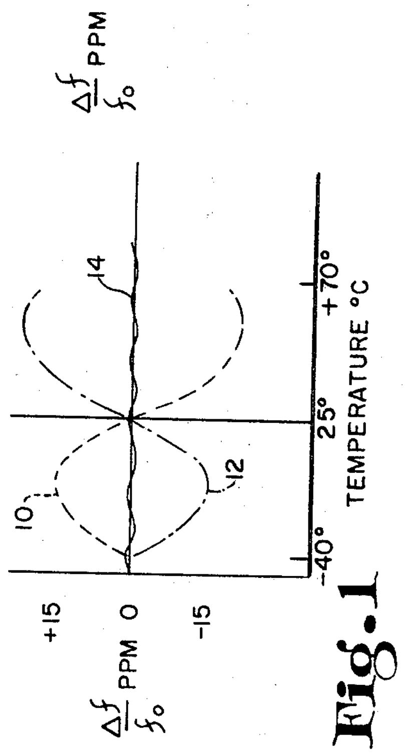
FIG. 1 is a graph showing the variation in oscillator frequency due to changes in temperature, and the temperature compensation curve and resultant oscillator curve.

In a crystal controlled oscillator the resonant frequency of the oscillator may vary with temperature in a manner which approximates a sine curve as illustrated by the dotted line curve 10 in FIG. 1. That is, when the temperature begins to rise from the normal temperature of 25° C., the frequency of the oscillator begins to decrease and reaches a minimum level designated as the lower turning point, whereupon a further increase in temperature causes the oscillator frequency to begin to increase from said minimum value and to approach the nominal room temperature frequency. As the ambient temperature decreases from room temperature, the frequency of the oscillator begins to increase reaching an upper turning point and then decreasing toward the room temperature value as said temperature is further decreased. The chain-link curve 12 in FIG. 1 shows the temperature characteristic of the compensating network and it can be seen that the temperature compensation characteristic is a mirror image about the X-axis of the above described frequency variation vs. temperature curve. The resultant frequency variation vs. temperature curve is shown as the full line 14 in FIG. 1, and results from the combined oscillator and compensating circuit curves. The typical values, as used in FIG. 1, show that for a temperature range of −40° C. to +70° C. the oscillator frequency without compensation will vary ±15 parts per million (p.p.m.). However, by incorporating the compensating circuit, it is seen by the full line 14 that the frequency variations over the same temperature range decrease greatly, and in fact such variations can be held to less than ±0.1 p.p.m.

Figure 2:
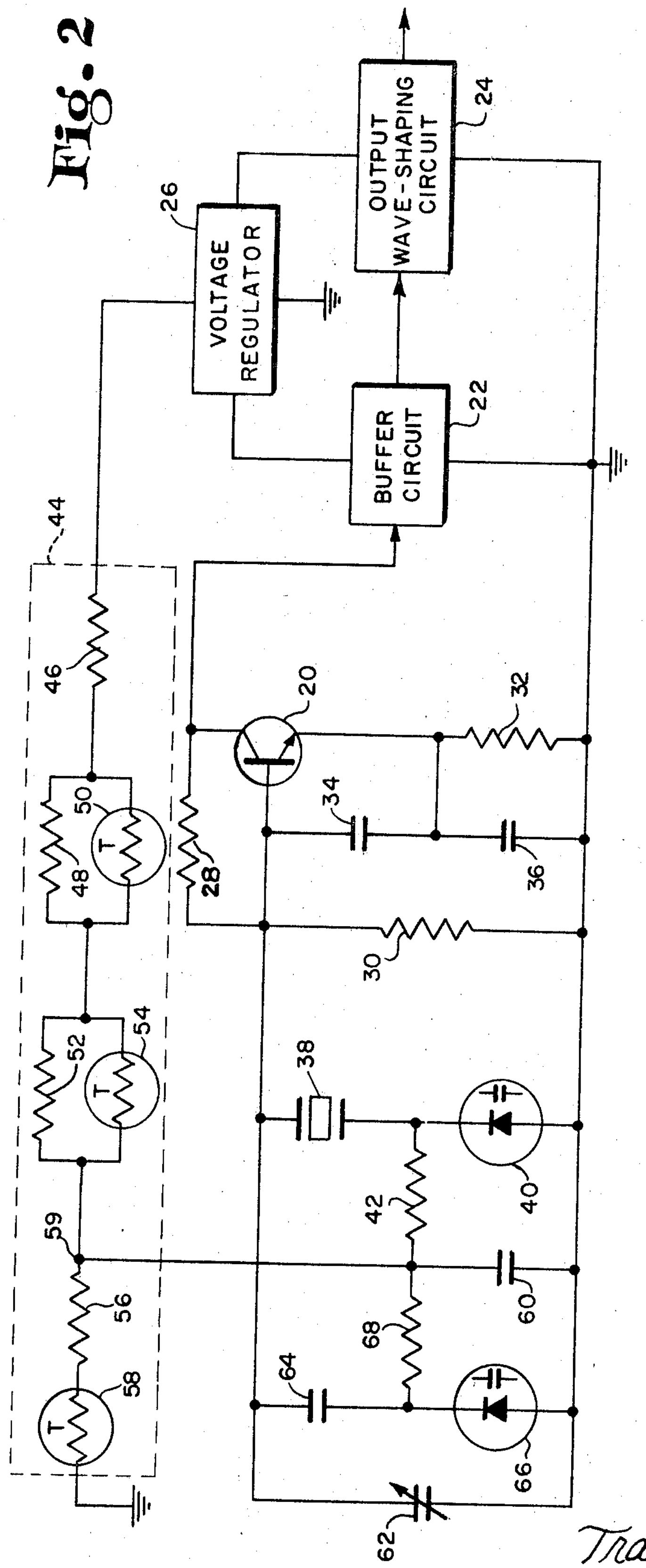
FIG. 2 is a combined block diagram and schematic diagram of an oscillator circuit embodying the invention.

As shown in FIG. 2, a temperature compensated crystal oscillator is formed around a transistor 20. The output of the oscillator is taken from the collector of the transistor 20 and applied to a buffer circuit 22 whose output is connected to a wave shaping circuit 24 which shapes the oscillator signal so that it may be applied to a load. The buffer circuit merely isolates the oscillator from the load so that changes in load conditions do not affect the operation of the oscillator. Supply voltages for the buffer and wave shaping circuits 22 and 24 are obtained from a voltage regulator 26.

In addition to the transistor 20, the oscillator shown in FIG. 2 comprises a resistor 28 connected between the collector and base of the transistor and a resistor 30 connected between said base and ground. A resistor 32 is coupled from the emitter of the transistor to ground, and the emitter is also connected to the junction between a pair of capacitors 34 and 36 having their other ends connected respectively to the base of the transistor and to ground. The resonant frequency of the oscillator is controlled by a crystal 38 having one of its leads connected to the base of the transistor 20 and its other lead connected to the cathode of a varactor diode 40, the anode of which is connected to ground. If the varactor diode 40 is considered as being merely a capacitor, then the oscillator components described thus far, that is 20 and 28 through 40, form the basic oscillator circuit. The frequency will depend on the crystal 38 and the capacitive load on that crystal, which load is comprised of the capacitors 34 and 36 and the varactor 40. The temperature characteristic of this basic oscillator is represented by the dotted line 10 in FIG. 1 and approximates a sine curve.

To compensate for the variations in resonant frequency over a temperature range, a resistor 42 is coupled to the cathode of the varactor 40, and the other end of the resistor is coupled through a compensating circuit 44 to the voltage regulator 26. Thus, a DC voltage from the voltage regulator is applied through the compensating circuit 44 and the resistor 42 to bias the varactor diode 40. The temperature characteristic curve 12 of the compensating circuit 44 is also shown in FIG. 1 and it combines with the temperature characteristic curve 10 of the oscillator to provide the constant frequency curve 14 over the temperature range.

The compensating circuit 44 may comprise a resistor 46 having one of its ends connected to the voltage regulator and its other end connected to the junction between a resistor 48 and a thermistor 50. The opposite ends of resistor 48 and thermistor 50 are connected together and to the junction between a resistor 52 and a thermistor 54. The opposite ends of resistor 52 and thermistor 54 are connected together and to the resistor 42, and they are also connected to a resistor 56 which is coupled through a thermistor 58 to ground. Therefore, the compensating circuit 44 can be viewed as a voltage divider connected between the voltage regulator 26 and ground, and having its voltage tapped off at a point 59 between the resistor-thermistor pair 52–54 and the resistor 56. By proper selection of the resistor and thermistor values in the compensating circuit 44, the voltage at the tapped point 59 can be made to correspond to the curve 12 in FIG. 1, and the combination of curves 10 and 12 will produce the linear frequency over a large temperature variation as shown by curve 14. A capacitor 60 is connected from the tapped point 59 to a common potential point or ground. Said capacitor 60 serves as a filter so that the RF signals at the crystal are not coupled to the compensating circuit 44.

The circuit as it has been described thus far provides a temperature compensated crystal controlled oscillator having a resonant frequency which remains relatively constant over a wide temperature range. For example, as stated above, the oscillator without temperature compensation may vary as much as ±15 p.p.m. over a range of −40° C. to +70° C., whereas with the compensation circuit connected to the oscillator the variation in frequency may be limited to as little as ± 0.1 p.p.m. over the same temperature range, as shown by the curve 14 in FIGS. 1 and 3. As a crystal ages, however, its frequency at room temperature may drift away from the nominal value thereby requiring that an adjustment be made to bring the frequency back to said nominal value. Since the frequency of the crystal is dependent on its capacitive load, a variable capacitor 62 is connected in parallel with the series combination of the crystal 38 and varactor diode 40 for adjustment to vary the frequency of the oscillator back to the nominal value after the crystal has aged.

In the oscillator, the capacitive load on the crystal 38 includes the varactor diode 40 ($C_v$) in series with the parallel combination of the trimmer capacitor 62 ($C_t$) and the remaining capacitance in the circuit designated as $C_o$. At any temperature $T_1$ the required capacitance seen by the crystal 38 may be expressed as $$C_{req.}=\frac{C_v(C_t+C_o)}{C_v+C_t+C_o}$$

At any other temperature $T_2$, the capacitance required to be seen by the crystal will be different than at $T_1$ since the crystal characteristics themselves will be different at $T_2$ than they were at $T_1$. However, the capacitance of the varactor diode 40 will compensate for this required change. That is, the voltage applied to the varactor by the compensating circuit 44 will change the varactor capacitance to satisfy the new $C_{req.}$ When the value ($C_t$) of the trimmer capacitor 62 is varied, however, it is seen that the required capacitance cannot be met by the components described thus far since a change in $C_t$ is not compensated for by the changes in $C_v$. This causes the frequency characteristic of the oscillator to skew upward or downward away from the full line 14 shown in FIG. 3, and to follow the dotted curves **14*a* or 14*b*** depending respectively on whether the resonant frequency was trimmed up or down.

In order to linearize the skewed temperature characteristic which is due to adjustment of the trimmer capacitor 62, a fixed capacitor 64 and a second varactor diode 66 are connected in series with each other and in parallel with the trimmer capacitor 62. The cathode of the varactor diode 66 is connected through a resistor 68 to the junction between the resistor 42 and the capacitor 60 so that the compensating voltage from the compensating circuit 44 is applied through the resistor 68 to the second varactor diode 66. The resistor 68 and the capacitor 60 act as a low pass filter as does the combination of resistor 42 and capacitor 60 so that no RF signal is coupled from the second varactor diode 66 to the compensating circuit 44. These additional components perform in a dynamic manner to linearize the temperature characteristic, as shown in FIG. 3 at curves 14*c* and 14*d* which correspond respectively to a raising or lowering of the nominal frequency $f_0$ of the oscillator, and prevent said characteristic from skewing away from the horizontal curve 14 when the trimmer capacitor is adjusted.

Figure 3:
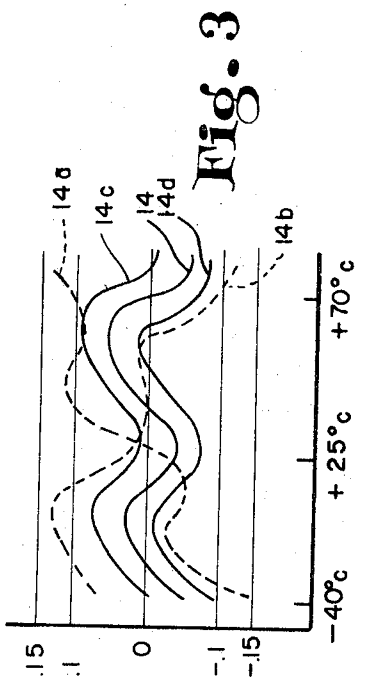
FIG. 3 is a graph showing the effect of frequency trimming two oscillators; one oscillator embodying the invention, and one without said invention.

The skewing effect, as shown at 14*a* and 14*b*, due to adjustments of the trimmer capacitor, may cause errors as great as .05 p.p.m. over the temperature range, and as shown in FIG. 3, if this value is added to the 0.1 p.p.m. change, which is the degree of accuracy to which the oscillator is controlled by the compensating circuit, said skewing effect increases the inaccuracy of the frequency by 50%. The linearizing components may limit this skew value to approximately .005 parts per million, thereby effectively eliminating frequency inaccuracies due to changes in the trimmer capacitor.

It has been found that the skewing effect can be linearized most accurately if the varactor diodes have the same nominal value and if the capacitor 64 is fixed at approximately one-half the value of the varactor diode 66. The following table gives representative values for the various components for a 3-mHz. oscillator:

Transistor 20—2N708
Resistors:
- 28—27K
- 30—470K
- 32—5.6K
- 42—100K
- 68—100K Capacitors:
- 34—100 pf.
- 36—370 pf.
- 60—.01 μf.
- 62—1–10 pf.
- 64—24 pf.

Varactors:
- 40—Nominal capacitance 47 pf.
- 66—Nominal capacitance 47 pf.

In the above described circuit it has been found that for a temperature range of approximately —40° C. to +70° C. the compensating circuit as shown in FIG. 2 will be effective if it is connected across a DC voltage of approximately 8 volts and if the following values are assigned to the resistors and thermistors Resistors:
- 46—10K
- 48—200K
- 52—100K
- 56—65K Thermistors:
- 50—50K
- 54—100K
- 58—2K Component values for the compensating circuit must be chosen carefully, however, since they are critical to the accuracy of the temperature characteristic of the circuit. A method for choosing said component values is given in Technical Report ECOM–02282–11, entitled Frequency Temperature Compensation Techniques for Quartz Crystal Oscillators, which report was prepared by the Bendix Corporation with relation to Military Contract No. DA 36–039 AMC–02282 (E), DA Project No. 1E6–22001–A–058.

We claim:

1. A temperature compensated oscillator having a crystal for controlling the oscillator frequency and a first varactor diode coupled to the crystal for changing the capactive load on the crystal to compensate for temperature caused changes in said frequency, wherein the improvement comprises, a temperature-varied voltage divider coupled to the first varactor diode for varying the DC bias on said diode to thereby vary its capacitance, a variable capacitor coupled to said crystal to form a portion of the capacitive load on said crystal, said variable capacitor being adjustable to compensate for changes in said frequency due to aging of the crystal, and a second varactor diode and a fixed capacitor coupled together and to said variable capacitor, said second varactor diode being coupled to said voltage divider for receiving a temperature-varying DC bias voltage therefrom for varying the capacitance of said second diode to compensate for temperature caused nonlinearities in said frequency resulting from adjustments of said variable capacitor.

2. The invention as set forth in claim 1 in which said temperature-varied voltage divider comprises a resistance network formed by resistors and thermistors, said network being adapted to be coupled across a DC potential source.

3. The invention as set forth in claim 1 in which said fixed capacitor and second varactor diode are connected to form a series combination which is connected in parallel with said variable capacitor.

4. The invention as set forth in claim 3 in which said second varactor diode has an anode electrode connected to said variable capacitor and a cathode electrode connected to said fixed capacitor, a resistor is connected between said voltage divider and said cathode, and a filter capacitor is connected from a common potential point of said oscillator to the junction between said resistor and said voltage divider, whereby the resistor and filter capacitor isolate the oscillator frequency from the voltage divider.

5. In a temperature compensated oscillator circuit, a crystal coupled in said circuit for controlling the oscillator frequency, a first varactor diode connected in series with said crystal, a temperature-varied voltage divider coupled to the first varactor diode for varying the DC bias on said diode to thereby vary its capacitance, a variable capacitor connected in parallel with the series combination of said crystal and first varactor diode to form a portion of the capacitive load on said crystal, said variable capacitor being adjustable to compensate for changes in said frequency due to aging of the crystal, and a second varactor diode and a fixed capacitor coupled together and to said variable capacitor, said second varactor diode being coupled to said voltage divider for receiving a temperature-varying DC bias voltage therefrom for varying the capacitance of said second diode to compensate for temperature caused nonlinearities in said frequency resulting from adjustments of said variable capacitor.

6. The invention as set forth in claim 5 which said fixed capacitor and second varactor diode are connected to form a series combination which is connected in parallel with said variable capacitor.

7. The invention as set forth in claim 6 in which said second varactor diode has an anode electrode connected to said variable capacitor and a cathode electrode connected to said fixed capacitor, a resistor is connected between said voltage divider and said cathode, and a filter capacitor is connected from a common potential point of said oscillator to the junction between said resistor and said voltage divider, whereby the resistor and filter capacitor isolate the oscillator frequency from the voltage divider.

8. The invention as set forth in claim 7 in which the temperature varied voltage divider comprises a resistance network formed by resistors and thermistors, said network being adapted to be coupled across a DC potential source.

9. The invention as set forth in claim 8 in which the nominal capacitance values of the first and second varactor diodes are equal and the value of said fixed capacitor is approximately one-half the capacitance value of said diodes.

References Cited

UNITED STATES PATENTS

| | | | |
|---|---|---|---|
| 3,176,244 | 3/1965 | Newell et al. | 331—116 |
| 3,322,981 | 5/1967 | Brenig | 331—116 X |
| 3,428,916 | 2/1969 | Hovenga et al. | 331—116 |

ROY LAKE, Primary Examiner

S. H. GRIMM, Assistant Examiner

U.S. Cl. X.R.

331—109, 176